(12) United States Patent
Ballagh et al.

(10) Patent No.: US 7,739,092 B1
(45) Date of Patent: Jun. 15, 2010

(54) FAST HARDWARE CO-SIMULATION RESET USING PARTIAL BITSTREAMS

(75) Inventors: Jonathan B. Ballagh, Boulder, CO (US); L. James Hwang, Menlo Park, CA (US); Roger B. Milne, Boulder, CO (US); Kevin Marc Neilson, Boulder, CO (US); Nabeel Shirazi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 438 days.

(21) Appl. No.: 11/343,554

(22) Filed: Jan. 31, 2006

(51) Int. Cl.
*G06F 17/50* (2006.01)

(52) U.S. Cl. .............. 703/13; 703/14; 703/20; 703/21; 713/1; 713/100; 716/16; 716/17

(58) Field of Classification Search .......... 703/2, 703/14, 13, 22, 21; 716/16, 5; 714/733, 714/35; 326/39, 41; 717/135; 713/189
See application file for complete search history.

(56) References Cited

U.S. PATENT DOCUMENTS

| | | | | |
|---|---|---|---|---|
| 5,530,813 | A * | 6/1996 | Paulsen et al. | 710/317 |
| 5,946,219 | A * | 8/1999 | Mason et al. | 716/16 |
| 6,205,574 | B1 * | 3/2001 | Dellinger et al. | 716/16 |
| 6,255,848 | B1 * | 7/2001 | Schultz et al. | 326/41 |
| 6,265,894 | B1 * | 7/2001 | Reblewski et al. | 326/39 |
| 6,272,451 | B1 * | 8/2001 | Mason et al. | 703/13 |
| 6,654,919 | B1 * | 11/2003 | Watkins | 714/733 |
| 6,678,646 | B1 * | 1/2004 | McConnell et al. | 703/22 |
| 6,769,107 | B1 * | 7/2004 | Watkins | 716/16 |
| 6,802,026 | B1 * | 10/2004 | Patterson et al. | 714/35 |
| 7,143,376 | B1 * | 11/2006 | Eccles | 716/5 |
| 7,249,010 | B1 * | 7/2007 | Sundararajan et al. | 703/21 |
| 2001/0049593 | A1 * | 12/2001 | McConnell et al. | 703/14 |
| 2002/0199110 | A1 * | 12/2002 | Kean | 713/189 |
| 2003/0149962 | A1 * | 8/2003 | Willis et al. | 717/135 |
| 2006/0241921 | A1 * | 10/2006 | Willis | 703/2 |

OTHER PUBLICATIONS

Karen A. Tomko, Anurag Tiwwari A Hardware/Software Co-debugging for Reconfigurable Computing IEEE 2000, 0-7695-0786-7.*
Bingfeng Mei, Patrick Schaumont Serge Vernalde A Hardware-Software Partitioning and Scheduling Algorithm for Dynamically Reconfigurable Embedded Systems.*
Xilinx Correcting Single-Event Upsets Through Virtex Partial Configuration, XAPP216 Jun. 1, 2000.*
Xilinx, Inc.; "Two Flows for Partial Reconfiguration: Module Based or Difference Based"; XAPP290 (v1.2); Sep. 9, 2004; pp. 1-28.

* cited by examiner

*Primary Examiner*—Kamini S Shah
*Assistant Examiner*—Cuong V Luu
(74) *Attorney, Agent, or Firm*—Kevin T. Cuenot; LeRoy D. Maunu; Lois D. Cartier

(57) ABSTRACT

A method of resetting a programmable logic device (PLD) for use with hardware co-simulation can include loading a full bitstream into the PLD. The full bitstream can program the PLD with a circuit design to be used with a first simulation. The method further can include loading a partial bitstream into the PLD thereby resetting at least one component of the circuit design that does not have a reset function such that the circuit design is initialized for use in a subsequent simulation.

17 Claims, 2 Drawing Sheets

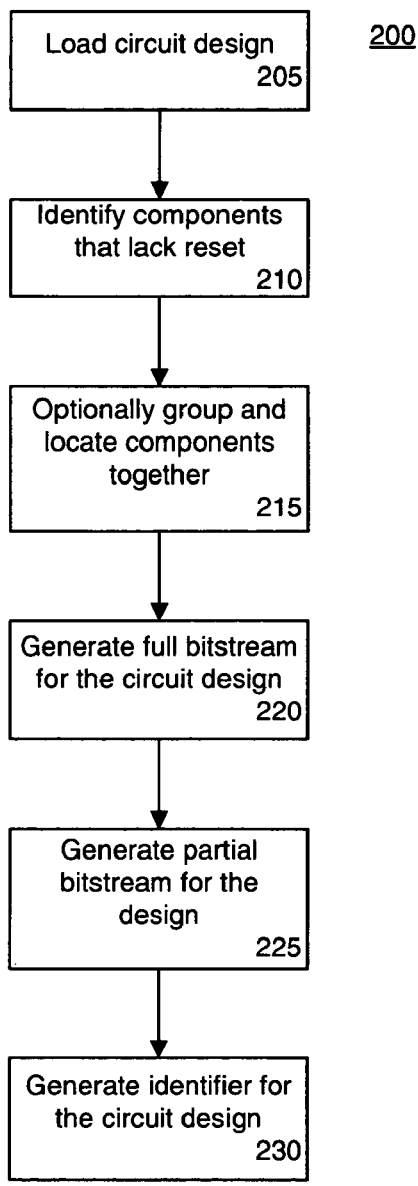
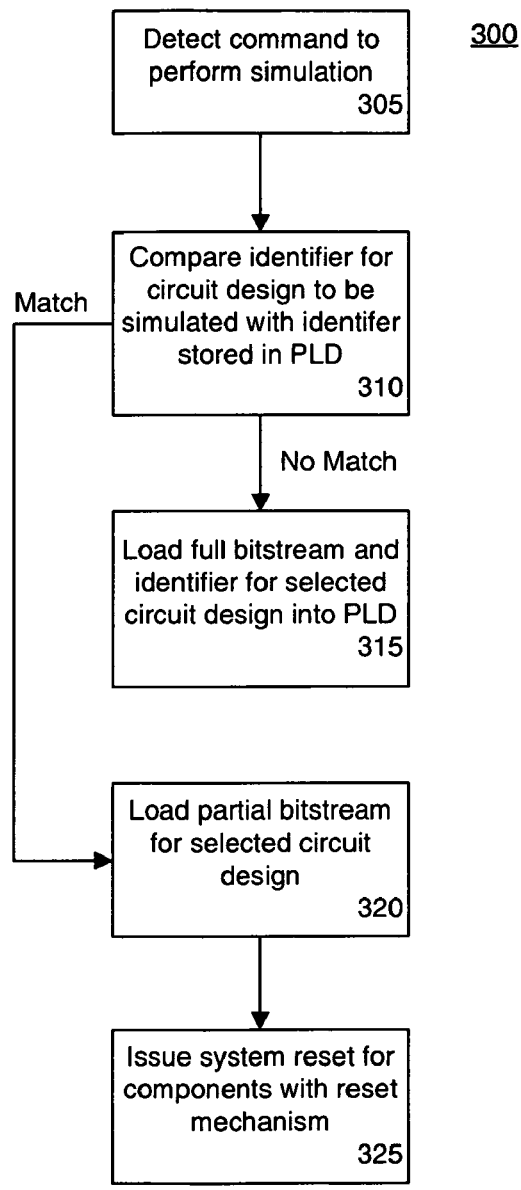
FIG. 2                    FIG. 3

FAST HARDWARE CO-SIMULATION RESET USING PARTIAL BITSTREAMS

BACKGROUND

1. Field of the Invention

The present invention relates to the field of integrated circuits and, more particularly, to facilitating more efficient co-simulation of physical implementations of integrated circuits with software environments.

2. Description of the Related Art

Electronic circuit designs can be constructed, simulated, debugged, and translated into electronic hardware using a High Level Modeling System (HLMS). Typically, an HLMS is implemented as a software-based design tool that provides blocks which can be combined to build an electronic circuit. A block refers to a high level software construct that represents a particular circuit function, such as multiplexing, addition, multiplication, or the like. Blocks may have ports that can produce and consume signals, and may be arranged within the HLMS to form a circuit and/or system. Communication among the blocks can be represented by wires, or signals, that graphically link the blocks. The design may be simulated within the HLMS once it is constructed. Some HLMS tools can generate a hardware implementation from the block representation of the circuit design. For example, an HLMS may generate the bitstream necessary to program a field programmable gate array (FPGA) or can generate the hardware description language (HDL) files necessary to specify the hardware design.

One example of an HLMS is System Generator for DSP™ (Sysgen), available from Xilinx, Inc. of San Jose, Calif. Sysgen is a system level modeling tool that facilitates FPGA hardware design. Sysgen provides a wide range of blocks that can be automatically compiled into a design suitable for an FPGA. Among these blocks are high level abstractions that implement complex functions, including digital signal processing as well as communication and control logic. In addition, access to underlying FPGA resources can be provided through low level block abstractions that facilitate the construction of highly efficient FPGA designs.

An electronic design typically is simulated in an HLMS using program logic that models block behavior. It also is possible to incorporate external hardware into an HLMS simulation. The process of simulating a circuit design where a portion of the circuit design is emulated in external hardware which works cooperatively with the HLMS is referred to as hardware co-simulation, or simply co-simulation, as used herein. The portion of the circuit design that is emulated using external hardware executes in a fraction of the time that would otherwise be required were that portion of the circuit design to be simulated in software. In consequence, co-simulation can dramatically increase the speed of simulation.

The "external hardware" used in co-simulation refers to an electronic circuit board, referred to as a co-simulation platform, that hosts one or more programmable logic devices (PLDs). Typically, the PLD is an FPGA, which is highly suited to co-simulation as different circuit descriptions can be compiled and executed on the same hardware device. In any case, the computer system hosting the HLMS is communicatively linked to the co-simulation platform. The portion of the circuit design that is emulated in external hardware is implemented within the PLD.

Presently, before a circuit design can be co-simulated, the PLD that is disposed upon the co-simulation platform must be programmed using an appropriate configuration bitstream. Typically, the PLD is fully reprogrammed at the start of each simulation to ensure it is initialized to a known state. Thus, responsive to a user command to begin co-simulation, the HLMS, prior to starting the simulation, first completely reprograms the PLD. The amount of time needed to program the PLD, however, can be lengthy and varies according to several different factors. These factors can include, but are not limited to, the size of the circuit design, and thus the size of the bitstream being loaded into the PLD, the bandwidth of the communication link between the co-simulation platform and the host processing system, and the like.

PLDs are fully reprogrammed at the start of each simulation to reset the device and place it in a known state. This ensures that the co-simulation hardware remains bit and cycle faithful to the software model from which the PLD implementation was derived. While many components within a PLD, and particularly within an FPGA, can be reset, others cannot. That is, some resources, such as block memories and SRL16 primitives which can be implemented on selected FPGAs available from Xilinx, Inc., lack an explicit reset mechanism. The only way to initialize such components is to fully reload the FPGA. Accordingly, the only way to ensure that circuit design is placed into a known state is to fully reprogram the FPGA prior to beginning each simulation.

It would be beneficial to reduce the amount of time needed to reconfigure a PLD while still ensuring that the device is properly initialized for use with co-simulation.

SUMMARY

The present invention provides methods and articles of manufacture which relate to resetting and/or reconfiguring a programmable logic device (PLD) that is used in a co-simulation environment. One embodiment of the present invention can include a method of resetting a PLD for use with hardware co-simulation. The method can include loading a full bitstream into the PLD, wherein the full bitstream programs the PLD with a circuit design to be used with a first simulation. The method also can include loading a partial bitstream into the PLD thereby resetting at least one component of the circuit design that does not have a reset mechanism, such that the circuit design is initialized for use in a subsequent simulation.

The method can include resetting components of the circuit design that have a reset mechanism. The partial bitstream can reprogram only portions of the PLD that include components that do not have a reset mechanism. The method further can include determining that the circuit design used in the first simulation will be used in the subsequent simulation. The partial bitstream can be selected from one or more bitstreams corresponding to the circuit design. The partial bitstream can be selected from the one or more bitstreams corresponding to the circuit design according to a comparison between an identifier of the circuit design of the first simulation and an identifier of a circuit design to be used in the subsequent simulation.

The determining step can include storing an identifier of the circuit design of the first simulation, comparing the identifier of the circuit design of the first simulation with an identifier of a circuit design to be used in the subsequent simulation, and selecting the partial bitstream if the identifier of the circuit design of the first simulation is equivalent to the identifier of the circuit design to be used in the subsequent simulation. In one embodiment, if an identifier of the circuit design of the first simulation is not equivalent to an identifier of the circuit design to be used in the subsequent simulation, the method can include selecting a full bitstream corresponding to the circuit design to be used in the subsequent simulation.

Another embodiment of the present invention can include a method of resetting a PLD for use with hardware co-simulation including identifying components of a circuit design that do not have a reset mechanism, generating a full bitstream specifying the entire circuit design, and generating a partial bitstream for the circuit design, wherein the partial bitstream comprises data only for portions of the circuit design having a component that lacks a reset mechanism. The method can include determining that the circuit design was used in a first simulation and will be used in a second consecutive simulation and programming the PLD using the partial bitstream, thereby resetting the components that do not have a reset mechanism.

The partial bitstream can reprogram portions of the PLD that comprise at least one component lacking a reset mechanism. The method further can include selecting the partial bitstream according to the determining step. The determining step can include storing an identifier of the circuit design of the first simulation and comparing the identifier of the circuit design of the first simulation with an identifier of a circuit design to be used in the second simulation.

Yet another embodiment of the present invention can include a machine readable storage, having stored thereon a computer program having a plurality of code sections for implementing the various steps and functions disclosed herein.

BRIEF DESCRIPTION OF THE DRAWINGS

There are shown in the drawings, embodiments which are presently preferred, it being understood; however, that the invention is not limited to the precise arrangements and instrumentalities shown.

FIG. 2 is a flow chart illustrating a method of generating bitstreams in accordance with another embodiment of the present invention.

FIG. 3 is a flow chart illustrating a method of configuring a programmable logic device for use with co-simulation in accordance with yet another embodiment of the present invention.

DETAILED DESCRIPTION OF THE INVENTION

Figure 1:
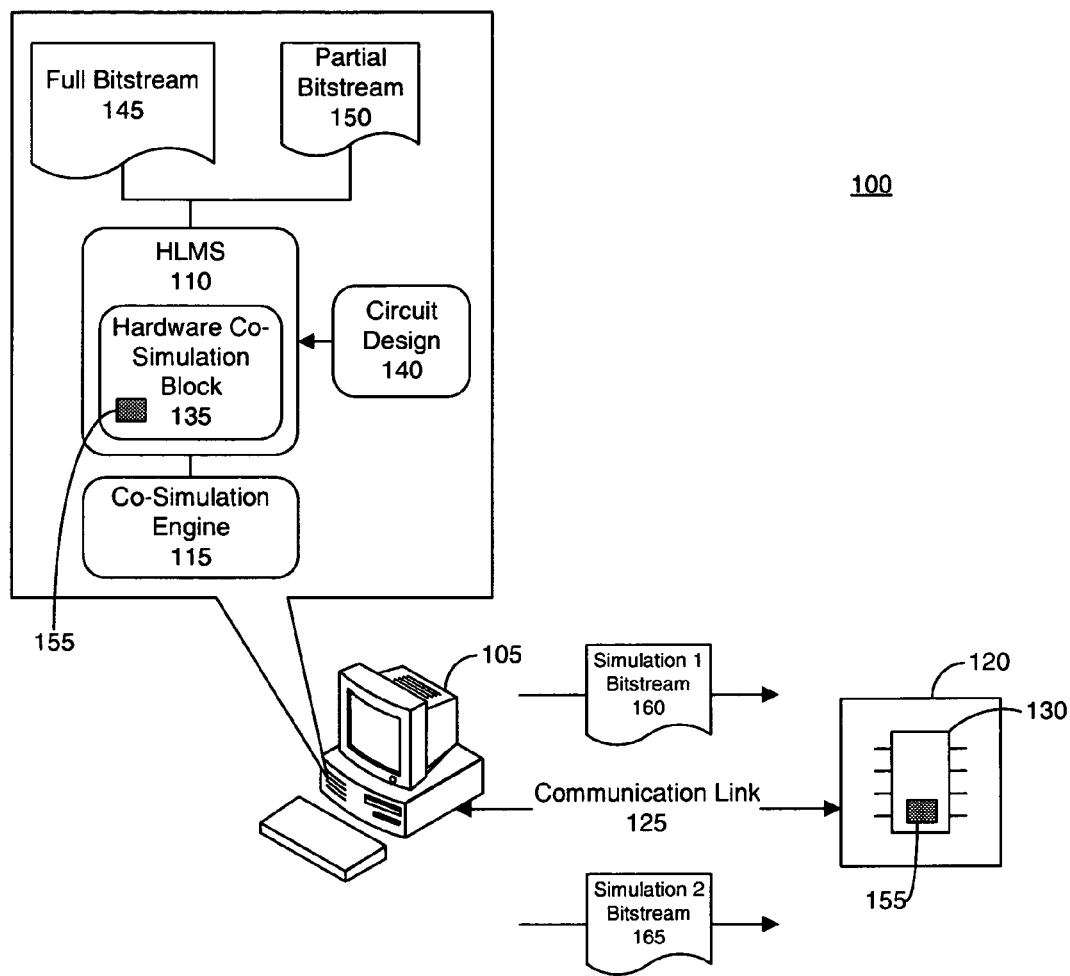
FIG. 1 is a block diagram illustrating a co-simulation environment configured in accordance with one embodiment of the present invention.

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to configuring a programmable logic device (PLD) for use within a co-simulation environment. In accordance with the embodiments disclosed herein, a PLD that is used within a co-simulation environment can be reset in an expedited manner using a partial bitstream. As noted, it is necessary to reset components of the circuit design implemented on the PLD prior to each simulation. In consequence, conventional co-simulation techniques reload the PLD using a full bitstream prior to each simulation even in cases where the same circuit design is used from one simulation to the next.

Because not all components of a PLD, and in particular a field programmable gate array (FPGA), have explicit reset mechanisms, the PLD is reprogrammed prior to each simulation using the full bitstream. The embodiments disclosed herein, however, utilize a partial bitstream in particular cases to reconfigure only selected portions of the PLD. Specifically, only those portions of the PLD that include components that do not have a reset mechanism are reprogrammed by the partial bitstream. This allows the PLD to be reset between subsequent simulations involving the same circuit design in less time than would otherwise be required using a full bitstream.

FIG. 1 is a block diagram illustrating a co-simulation environment 100 configured in accordance with one embodiment of the present invention. As shown, system 100 can include a host computer system 105 which can execute a high level modeling system (HLMS) 110 and a co-simulation engine 115. The host computer system 105 is communicatively linked with a hardware platform 120 via a communication link 125. The hardware platform 120 includes a PLD 130, such as an FPGA. As noted, co-simulation, or hardware co-simulation, refers to the situation in which a circuit design, or a portion of a circuit design, in this case implemented in PLD 130, is incorporated within a design and/or simulation environment implemented using HLMS 110.

HLMS 110 typically includes a hardware co-simulation block 135, which is a software proxy for a circuit design 140 to be implemented in PLD 130. The hardware co-simulation block 135 can function much the same way as other software blocks of the HLMS 110 in that signals from other blocks (i.e. software-based models of physical components and/or systems) within the HLMS 110 can be consumed by the hardware co-simulation block 135 and signals generated by hardware co-simulation block 135 can be provided to, and interpreted by, other blocks within the HLMS 110.

The hardware co-simulation block 135 communicates with the co-simulation engine 115 that typically is distinct from the HLMS 110, but can execute within the host computer system 105. In general, the hardware co-simulation block 135 provides generic function calls to the co-simulation engine 115. These generic function calls can include, but are not limited to, opening and closing the hardware platform 120, managing data I/O with the hardware platform 120, and controlling clock sources for the PLD 130. The co-simulation engine 115 translates the generic function calls from the hardware co-simulation block into instructions specific to the hardware platform 120, and thus, the PLD 130. The instructions are sent from the co-simulation engine 115 to the hardware platform 120 via communication link 125.

In operation, the HLMS 110 can load and process the circuit design 140. Circuit design 140 specifies the circuit or system that is to be implemented within the PLD 130 and incorporated into a simulation conducted using HLMS 110. Circuit design 140 can be expressed in a hardware description language, whether Verilog VHDL, or another suitable hardware description language or syntax. Regardless, the particular hardware description language used to specify circuit design 140 is not intended to limit the present invention. From circuit design 140, HLMS 110 can generate a full bitstream 145 as well as a partial bitstream 150.

As known, the PLD 130, and particularly an FPGA, is programmed by loading a stream of configuration data, referred to as a bitstream, into internal configuration memory cells. The configuration data can be read from memory external to the PLD 130 or can be written to the PLD 130 by an external device, i.e. host computer system 105 and HLMS 110. Once loaded into the configuration memory cells, the configuration data effectively programs the interconnect structure, configurable logic blocks (CLBs), input/output blocks (IOBs), and other components thereby specifying the device configuration. The collective states of the individual memory cells determine the functionality of the PLD 130.

The full bitstream 145 specifies the entirety of circuit design 140. By comparison, the partial bitstream 150 does not specify the entirety of circuit design 140. Rather, partial bitstream 150 specifies portions of the circuit design 140 that contain components that do not have an explicit reset mechanism. In consequence, the partial bitstream 150 is smaller in size than the full bitstream 145 and, as such, requires less time to load into PLD 130.

For a given circuit design that is to be loaded into the PLD 130 for co-simulation, the HLMS 110 can derive an identifier 155. Identifier 155 can uniquely refer to, or indicate, circuit design 140. Identifier 155 can be stored within the host computer system 105, for example within the HLMS 110 or within the hardware co-simulation block 135 as shown. When circuit design 140 is loaded into PLD 130 for the first time, a copy of identifier 155 also can be stored within the co-simulation platform 120 and/or PLD 130. In one embodiment, for example, identifier 155 can be stored within a register of the PLD 130 that can be accessed by the host computer system 105.

Prior to a simulation, the HLMS 110 can compare the identifier 155 that is stored within the HLMS 110 with the identifier 155 that is stored within the PLD 130. If the two are the same, the same circuit design used in a prior simulation is also being used in a subsequent simulation. That is, a circuit design already implemented within PLD 130 is being used in a next simulation. If not, a new circuit design is being used in a next or subsequent simulation. Thus, when circuit design 140 is first used in a simulation, i.e. simulation 1, the full bitstream 145 can be loaded into PLD 130 as simulation 1 bitstream 160. For subsequent simulations using circuit design 140, partial bitstream 150 can be loaded into PLD 130 as simulation 2 bitstream 165. In one embodiment the partial bitstream 150 is a sub-set of the full bit stream 145. In another embodiment the partial bitstream 150 is a separate bitstream smaller in size than the full bitstream 150, but not necessarily a subset. A system reset is issued for components with an explicit reset mechanism. Accordingly, the configuration of PLD 130 takes less time when the partial bitstream 150 is loaded. Loading partial bitstream 150 effectively re-instantiates, and accordingly resets, components that do not have resets.

FIG. 2 is a flow chart illustrating a method 200 of generating bitstreams in accordance with another embodiment of the present invention. Method 200 can be implemented using a system such as the one illustrated with reference to FIG. 1. Accordingly, in step 205, a circuit design can be loaded into an HLMS. In step 210, the HLMS can process the circuit design and identify any components specified by the circuit design that do not have reset functions.

Step 215 is optional in that if it is performed, the number of portions of the PLD, for example frames, cells, or other physical regions on the PLD, that may require reconfiguration can be reduced and/or minimized. In step 215, the components that do not have reset functions can be grouped together on the PLD. Grouping such components together can result in a further reduction in the size of the partial bitstream and therefore further decrease the amount of time needed to reset the PLD before conducting a simulation. That is, if components that lack reset functions are physically grouped into a portion of the PLD that can be programmed using a same frame or minimum number of frames, the partial bitstream can be further minimized.

In step 220, the full bitstream can be generated. As noted, the full bitstream is the bitstream that specifies the entire circuit design to be loaded into the PLD for purposes of co-simulation. In step 225, the partial bitstream can be generated for the circuit design to be loaded into the PLD for co-simulation. The partial bitstream specifies only those portions of the circuit design that include components that lack resets. For example, if each frame or cell that includes a component lacking a reset function is identified, only data responsible for programming such frames or cells need be included in the partial bitstream. Ideally, the partial bitstream includes information relating only to those resources of the PLD that lack explicit reset mechanisms.

It should be appreciated that it may be the case that components with explicit reset mechanisms will be included within frames and/or cells that also include components lacking such mechanisms. Accordingly, both varieties of components within these frames or cells would be reconfigured by the partial bitstream. A system reset can be issued by the HLMS to reset components having a reset mechanism that are not located within regions of the PLD that are reconfigured by the partial bitstream.

According to one embodiment of the present invention, the partial bitstream can be generated using a technique referred to as difference-based partial reconfiguration flow. This manner of generating a partial bitstream entails making a small change to a design and then generating a bitstream based only on the differences between the two designs. There are two main ways a circuit design can be altered to be utilized with difference-based partial reconfiguration. The first is to change the front-end at the HDL, or schematic, level of the circuit design. The second is to implement the change at the back-end by altering the NCD file, which specifies a fully routed circuit design.

Front-end changes require re-synthesis and re-implementation to create a newly placed and routed NCD file. Because only particular components are being reset to an initialized state, however, the circuit design can be changed at the back-end, thereby alleviating the need for re-synthesis and re-implementation. The HLMS can produce the partial bitstream that modifies only the relevant sections of the circuit design, i.e. only those portions including a component without an explicit reset. Further details regarding partial bitstream generation can be found in Xilinx Application Note XAPP290, entitled "Two Flows for Partial Reconfiguration: Module based or Difference Based", Sep. 9, 2004, which is fully incorporated herein by reference. Although this reference discusses partial bitstream generation in a step-by-step manner, it should be appreciated that the steps described herein regarding partial bitstream generation can be performed automatically, with minimal or no user involvement. This is possible as the partial bitstream is generated for purposes of resetting components of the circuit design and not making alterations to the circuit design.

In step 230, an identifier for the circuit design can be generated. The identifier can be generated in any of a variety of different ways, so long as the circuit design is uniquely represented by the identifier. In one embodiment, the identifier can be generated using a hash of various design parameters for the circuit design. For example, the hash can be created using parameters relating to port information, device information, the circuit design name, and the like.

FIG. 3 is a flow chart illustrating a method 300 of configuring a PLD for use with co-simulation in accordance with another embodiment of the present invention. Method 300 can be implemented using a system as described with reference to FIG. 1. Further, method 300 can begin in a state where the full and partial bitstreams have been generated for one or more circuit designs to be loaded into the PLD for purposes of co-simulation.

In step 305, a command to perform a simulation can be received by the HLMS. The command can identify a particular system to be simulated as well as a particular circuit design to be loaded into a PLD which is to be incorporated into the simulation. In step 310, the HLMS can compare the identifier for the circuit design to be loaded into the PLD with an identifier for a circuit design that has already been loaded into the PLD. More particularly, the HLMS can locate the identifier for the circuit design to be loaded into the PLD. The HLMS then can communicate with the PLD to retrieve the identifier stored therein. The identifier stored within the PLD corresponds to the circuit design that has already been implemented within the PLD, for example, from a prior simulation. If no identifier has been stored in the PLD, i.e. in the case of a first simulation, then the identifier can be considered to be some constant indicative of this state.

A match between the two identifiers indicates that the next simulation to be performed utilizes the same circuit design as one that has already been loaded into the PLD. In that case, rather than reloading the entire circuit design using the full bitstream, only those portions of the circuit design that include components lacking reset functions need to be reloaded. Components that do have a reset mechanism and are located outside of portions of the circuit design to be reloaded with the partial configuration bitstream can be reset using a system reset function. Accordingly, in the case of a match between the two identifiers, the method can proceed to step 320 where the partial bitstream is loaded into the PLD. In step 325, the HLMS further can initiate a reset of the remainder of the circuit design implemented within the PLD.

If the two identifiers do not match, the method can proceed to step 315 where the full bitstream corresponding to the selected circuit design can be loaded into the PLD. In this case, the selected circuit design is not the same as the circuit design that was used in a prior simulation which has already been loaded into the PLD. Alternatively, it may be the case that the requested simulation is the first simulation and that no circuit design has been implemented within the PLD. In such a situation, no identifier has been loaded into the PLD, which also results in a no match condition. In any case, when the identifiers do not match a full bitstream corresponding to the circuit design specified in step 305 can be loaded into the PLD. The full bitstream is used to implement a circuit design in the case of a first simulation or in the case where the circuit design to be used in the current simulation is different from the circuit design that was used in the simulation immediately preceding the current simulation.

The embodiments described herein provide a technique for resetting a PLD between consecutive simulations in a co-simulation environment in less time than is required for conventional techniques. It should be appreciated that the examples disclosed herein have been provided for purposes of illustration only and, as such, are not intended to limit the scope of the present invention. Further, one or more of the steps described herein may be performed in a different order than discussed without departing from the spirit of the present invention.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically, i.e. communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. A method of resetting programmable logic in an integrated circuit device for use with hardware co-simulation comprising:

using a tool to identify components that do not have a reset mechanism;

grouping the components that do not have a reset mechanism into at least one selected portion of the programmable logic of the integrated circuit device;

generating a full bitstream comprising the at least one selected portion of the programmable logic of the integrated circuit device;

loading the full bitstream into the programmable logic, wherein the full bitstream programs the programmable logic with a circuit design to be used with a first hardware co-simulation; and responsive to determining that the circuit design for the first hardware co-simulation will be used within a subsequent hardware co-simulation, initializing the circuit design for use in the subsequent hardware co-simulation by:

loading, into the programmable logic, a partial bitstream of the circuit design, in lieu of the full bitstream, that reprograms the at least one selected portion of the programmable logic, thereby resetting each component in the at least one selected portion of the programmable logic that does not have a reset mechanism;

identifying components that do have a reset mechanism that are located outside of the at least one selected portion of the programmable logic; and resetting each identified component of the circuit design that does have a reset mechanism using the reset mechanism of the component in lieu of the partial bitstream.

2. The method of claim 1, wherein the partial bitstream reprograms only portions of the programmable logic comprising components that do not have a reset mechanism.

3. The method of claim 1, further comprising determining that the circuit design used in the first hardware co-simulation will be used in the subsequent hardware co-simulation.

4. The method of claim 3, said determining step further comprising:

storing an identifier of the circuit design of the first hardware co-simulation;

comparing the identifier of the circuit design of the first hardware co-simulation with an identifier of a circuit design to be used in the subsequent hardware co-simulation; and selecting the partial bitstream if the identifier of the circuit design of the first hardware co-simulation is equivalent to the identifier of the circuit design to be used in the subsequent hardware co-simulation.

5. The method of claim 4, further comprising, if an identifier of the circuit design of the first hardware co-simulation is not equivalent to an identifier of the circuit design to be used in the subsequent hardware co-simulation, selecting a full bitstream corresponding to the circuit design to be used in the subsequent hardware co-simulation.

6. The method of claim 1, wherein said grouping comprises grouping the components that do not have the reset mechanism into the at least one selected portion of the programmable logic of the integrated circuit to require a minimum number of frames in the partial bitstream for partial reconfiguration.

7. The method of claim 1, further comprising selecting the partial bitstream from one or more bitstreams corresponding to the circuit design according to a comparison between an identifier of the circuit design of the first hardware co-simulation and an identifier of a circuit design to be used in the subsequent hardware co-simulation.

8. A method of resetting programmable logic in an integrated circuit device for use with hardware co-simulation comprising:

using a tool to distinguish between components of a circuit design that do not have a reset mechanism and components of the circuit design that do have a reset mechanism;

grouping the components that do not have a reset mechanism into at least one selected portion of the programmable logic of the integrated circuit device;

generating a full bitstream specifying the entire circuit design comprising the at least one selected portion of the programmable logic of the integrated circuit device;

generating a partial bitstream for the circuit design, wherein the partial bitstream comprises data only for the at least one selected portion of the programmable logic having the components that do not have a reset mechanism;

determining that the circuit design was used in a first hardware co-simulation and will be used in a second consecutive hardware co-simulation; and resetting the integrated circuit device by:

programming the at least one selected portion of the programmable logic using the partial bitstream, thereby resetting the components that do not have a reset mechanism; and resetting each component of the circuit design outside of the at least one selected portion of the programmable logic that does have a reset mechanism using the reset mechanism in lieu of the partial bitstream.

9. The method of claim 8, wherein said grouping comprises grouping the components that do not have a reset mechanism on the integrated circuit into the at least one selected portion to require a minimum number of frames in the partial bitstream for partial reconfiguration.

10. The method of claim 9, said determining step further comprising:

storing an identifier of the circuit design of the first hardware co-simulation; and comparing the identifier of the circuit design of the first hardware co-simulation with an identifier of a circuit design to be used in the second hardware co-simulation.

11. A machine readable storage, having stored thereon a computer program having a plurality of code sections comprising:

code for identifying components that do not have a reset mechanism;

code for grouping the components that do not have a reset mechanism into at least one selected portion of the programmable logic of the integrated circuit device;

code for generating a full bitstream comprising the at least one selected portion of the programmable logic of the integrated circuit device;

code for loading the full bitstream into the programmable logic in the integrated circuit device to be used within hardware co-simulation, wherein the full bitstream programs the programmable logic with a circuit design to be used with a first hardware co-simulation; and code for, responsive to determining that the circuit design for the first hardware co-simulation will be used within a subsequent hardware co-simulation, initializing the circuit design for use in the subsequent hardware co-simulation by:

loading, into the programmable logic, a partial bitstream of the circuit design, in lieu of the full bitstream, that reprograms the at least one selected portion of the programmable logic, thereby resetting each component in the at least one selected portion of the programmable logic that does not have a reset mechanism;

identifying components that do have a reset mechanism that are located outside of the at least one selected portion of the programmable logic; and resetting each identified component of the circuit design that does have a reset mechanism using the reset mechanism of the component in lieu of the partial bitstream.

12. The machine readable storage of claim 11, wherein the partial bitstream reprograms only portions of the programmable logic device comprising components that do not have a reset mechanism.

13. The machine readable storage of claim 11, further comprising code for determining that the circuit design used in the first hardware co-simulation will be used in the subsequent hardware co-simulation.

14. The machine readable storage of claim 13, said code for determining further comprising:
    code for storing an identifier of the circuit design of the first hardware co-simulation;
    code for comparing the identifier of the circuit design of the first hardware co-simulation with an identifier of a circuit design to be used in the subsequent hardware co-simulation; and
    code for selecting the partial bitstream if the identifier of the circuit design of the first hardware co-simulation is equivalent to the identifier of the circuit design to be used in the subsequent hardware co-simulation.

15. The machine readable storage of claim 14, further comprising, code for, if the identifier of the circuit design of the first hardware co-simulation is not equivalent to the identifier of the circuit design to be used in the subsequent hardware co-simulation, selecting a full bitstream corresponding to the circuit design to be used in the subsequent hardware co-simulation.

16. The machine readable storage of claim 13, further comprising code for selecting the partial bitstream from one or more bitstreams corresponding to the circuit design.

17. The machine readable storage of claim 11, further comprising code for selecting the partial bitstream from one or more bitstreams corresponding to the circuit design according to a comparison between an identifier of the circuit design of the first hardware co-simulation and an identifier of a circuit design to be used in the subsequent hardware co-simulation.

\* \* \* \* \*